(12) United States Patent
Nemani et al.

(10) Patent No.: US 7,087,536 B2
(45) Date of Patent: Aug. 8, 2006

(54) SILICON OXIDE GAPFILL DEPOSITION USING LIQUID PRECURSORS

(75) Inventors: Srinivas D. Nemani, Sunnyvale, CA (US); Young S. Lee, Santa Clara, CA (US)

(73) Assignee: Applied Materials, Santa Clara, CA (US)

( * ) Notice: Subject to any disclaimer, the term of this patent is extended or adjusted under 35 U.S.C. 154(b) by 0 days.

(21) Appl. No.: 10/931,742

(22) Filed: Sep. 1, 2004

(65) Prior Publication Data

US 2006/0046508 A1    Mar. 2, 2006

(51) Int. Cl.
*H01L 21/31* (2006.01)
*H01L 21/469* (2006.01)

(52) U.S. Cl. ............ 438/758; 438/771; 438/774

(58) Field of Classification Search ......... 438/758, 438/771, 774, 788, 400, 723, 711, 707, 783, 438/787
See application file for complete search history.

(56) References Cited

U.S. PATENT DOCUMENTS

| | | | |
|---|---|---|---|
| 4,410,559 A * | 10/1983 | Hamakawa et al. ........ 438/485 |
| 4,468,413 A | 8/1984 | Bachmann |
| 4,572,841 A | 2/1986 | Kaganowicz et al. |
| 4,690,746 A | 9/1987 | McInerney et al. |
| 4,737,379 A | 4/1988 | Hudgens et al. |
| 4,835,005 A | 5/1989 | Hirooka et al. |
| 4,851,370 A | 7/1989 | Doklan et al. |
| 4,872,947 A | 10/1989 | Wang et al. |
| 4,890,575 A | 1/1990 | Ito et al. |
| 4,892,753 A | 1/1990 | Wang et al. |
| 4,894,352 A | 1/1990 | Lane et al. |
| 4,960,488 A | 10/1990 | Law et al. |
| 5,000,113 A | 3/1991 | Wang et al. |
| 5,013,691 A | 5/1991 | Lory et al. |
| 5,037,514 A * | 8/1991 | Yamazaki .................. 438/788 |
| 5,089,442 A | 2/1992 | Olmer |
| 5,156,881 A | 10/1992 | Okano et al. |
| 5,204,141 A | 4/1993 | Roberts et al. |
| 5,215,787 A | 6/1993 | Homma |
| 5,271,972 A | 12/1993 | Kwok et al. |
| 5,275,977 A | 1/1994 | Otsubo et al. |
| 5,279,865 A | 1/1994 | Chebi et al. |
| 5,288,518 A | 2/1994 | Homma |
| 5,302,233 A | 4/1994 | Kim et al. |
| 5,314,724 A | 5/1994 | Tsukune et al. |

(Continued)

FOREIGN PATENT DOCUMENTS

EP    0 883 166 A2    9/1998

(Continued)

OTHER PUBLICATIONS

Abraham, "Reactive Facet Tapering of Plasma Oxide For Multilevel Interconnect Applications," VMIC Conference. pp. 115-121 (1987).

(Continued)

*Primary Examiner*—Walter L. Lindsay, Jr.
(74) *Attorney, Agent, or Firm*—Townsend Townsend Crew, LLP

(57) ABSTRACT

A silicon oxide film is deposited on a substrate disposed in a substrate processing chamber. The substrate has a gap formed between adjacent raised surfaces. A liquid Si—C—O—H precursor is vaporized. A flow of the vaporized liquid Si—C—O—H precursor is provided to the substrate processing chamber. A gaseous oxidizer is also flowed to the substrate processing chamber. A deposition plasma is generated inductively from the precursor and the oxidizer in the substrate processing chamber, and the silicon oxide film is deposited over the substrate and within the gap with the deposition plasma.

24 Claims, 5 Drawing Sheets

U.S. PATENT DOCUMENTS

| | | |
|---|---|---|
| 5,319,247 A | 6/1994 | Matsuura |
| 5,334,552 A | 8/1994 | Homma |
| 5,362,526 A | 11/1994 | Wang et al. |
| 5,385,763 A | 1/1995 | Okano et al. |
| 5,399,529 A | 3/1995 | Homma |
| 5,413,967 A | 5/1995 | Matsuda et al. |
| 5,416,048 A | 5/1995 | Blalock et al. |
| 5,420,075 A | 5/1995 | Homma et al. |
| 5,429,995 A | 7/1995 | Nishiyama et al. |
| 5,468,342 A | 11/1995 | Nulty et al. |
| 5,474,589 A | 12/1995 | Ohga et al. |
| 5,507,881 A | 4/1996 | Sichanugrist et al. |
| 5,525,550 A | 6/1996 | Kato |
| 5,563,105 A | 10/1996 | Dobuzinsky et al. |
| 5,571,576 A | 11/1996 | Qian et al. |
| 5,589,233 A | 12/1996 | Law et al. |
| 5,593,741 A | 1/1997 | Ikeda |
| 5,599,740 A | 2/1997 | Jang et al. |
| 5,614,055 A | 3/1997 | Fairbairn et al. |
| 5,621,241 A | 4/1997 | Jain |
| 5,624,582 A | 4/1997 | Cain |
| 5,629,043 A | 5/1997 | Inaba et al. |
| 5,645,645 A | 7/1997 | Zhang et al. |
| 5,648,175 A | 7/1997 | Russell et al. |
| 5,661,093 A | 8/1997 | Ravi et al. |
| 5,679,606 A | 10/1997 | Wang et al. |
| 5,710,079 A | 1/1998 | Sukarev |
| 5,712,185 A | 1/1998 | Tsai et al. |
| 5,719,085 A | 2/1998 | Moon et al. |
| 5,776,557 A | 7/1998 | Okano et al. |
| 5,786,039 A | 7/1998 | Brouquet |
| 5,804,259 A | 9/1998 | Robles |
| 5,807,785 A | 9/1998 | Ravi |
| 5,849,455 A | 12/1998 | Ueda et al. |
| 5,850,105 A | 12/1998 | Dawson et al. |
| 5,858,876 A | 1/1999 | Chew |
| 5,869,149 A | 2/1999 | Denison et al. |
| 5,872,052 A | 2/1999 | Iyer |
| 5,872,058 A | 2/1999 | Van Cleemput et al. |
| 5,874,350 A | 2/1999 | Nakagawa |
| 5,903,106 A | 5/1999 | Young et al. |
| 5,910,342 A | 6/1999 | Hirooka et al. |
| 5,913,140 A | 6/1999 | Roche et al. |
| 5,915,190 A | 6/1999 | Pirkle |
| 5,937,323 A | 8/1999 | Orczyk et al. |
| 5,939,831 A | 8/1999 | Fong et al. |
| 5,944,902 A | 8/1999 | Redeker et al. |
| 5,953,635 A | 9/1999 | Andideh |
| 5,968,610 A | 10/1999 | Liu et al. |
| 5,976,327 A | 11/1999 | Tanaka |
| 5,990,000 A | 11/1999 | Hong et al. |
| 5,990,013 A | 11/1999 | Berenguer et al. |
| 6,013,191 A | 1/2000 | Nasser-Faili et al. |
| 6,013,584 A | 1/2000 | M'Saad |
| 6,030,666 A | 2/2000 | Lam et al. |
| 6,030,881 A | 2/2000 | Papasouliotis et al. |
| 6,037,018 A | 3/2000 | Jang et al. |
| 6,039,851 A | 3/2000 | Iyer |
| 6,042,901 A | 3/2000 | Denison et al. |
| 6,059,643 A | 5/2000 | Hu et al. |
| 6,070,551 A | 6/2000 | Li et al. |
| 6,071,573 A | 6/2000 | Koemtzopoulos et al. |
| 6,074,959 A | 6/2000 | Wang et al. |
| 6,077,786 A | 6/2000 | Chakravarti et al. |
| 6,096,646 A | 8/2000 | Lee et al. |
| 6,106,678 A | 8/2000 | Shufflebotham et al. |
| 6,136,685 A | 10/2000 | Narwankar et al. |
| 6,147,009 A | 11/2000 | Grill et al. |
| 6,149,976 A | 11/2000 | Matsuki et al. |
| 6,149,986 A | 11/2000 | Shibata et al. |
| 6,167,834 B1 | 1/2001 | Wang et al. |
| 6,170,428 B1 | 1/2001 | Redeker et al. |
| 6,174,808 B1 | 1/2001 | Jang et al. |
| 6,182,602 B1 | 2/2001 | Redeker et al. |
| 6,184,158 B1 | 2/2001 | Shufflebotham et al. |
| 6,189,483 B1 | 2/2001 | Ishikawa et al. |
| 6,190,233 B1 | 2/2001 | Hong et al. |
| 6,191,026 B1 | 2/2001 | Rana et al. |
| 6,194,037 B1 | 2/2001 | Terasaki et al. |
| 6,194,038 B1 | 2/2001 | Rossman |
| 6,197,705 B1 | 3/2001 | Vassiliev |
| 6,200,412 B1 | 3/2001 | Kilgore et al. |
| 6,203,863 B1 | 3/2001 | Liu et al. |
| 6,217,658 B1 | 4/2001 | Orczyk et al. |
| 6,224,950 B1 | 5/2001 | Hirata |
| 6,228,751 B1 | 5/2001 | Yamazaki et al. |
| 6,230,650 B1 | 5/2001 | Yamazaki |
| 6,232,196 B1 | 5/2001 | Raaijmakers et al. |
| 6,313,010 B1 | 11/2001 | Nag et al. |
| 6,326,064 B1 | 12/2001 | Denison et al. |
| 6,335,288 B1 | 1/2002 | Kwan et al. |
| 6,346,302 B1 | 2/2002 | Kishimoto et al. |
| 6,372,291 B1 | 4/2002 | Hua et al. |
| 6,395,150 B1 | 5/2002 | Van Cleemput et al. |
| 6,416,823 B1 | 7/2002 | Li et al. |
| 6,448,186 B1 | 9/2002 | Olson et al. |
| 6,465,044 B1 | 10/2002 | Jain et al. |
| 6,503,843 B1 | 1/2003 | Xia et al. |
| 6,531,193 B1 | 3/2003 | Fonash et al. |
| 6,537,929 B1 | 3/2003 | Cheung et al. |
| 6,559,026 B1 | 5/2003 | Rossman et al. |
| 6,589,610 B1 | 7/2003 | Li et al. |
| 6,589,611 B1 | 7/2003 | Li et al. |
| 6,596,653 B1 | 7/2003 | Tan et al. |
| 6,596,654 B1 | 7/2003 | Bayman et al. |
| 6,607,983 B1 | 8/2003 | Chun et al. |
| 6,626,188 B1 | 9/2003 | Fitzsimmons et al. |
| 6,652,924 B1 | 11/2003 | Sherman |
| 6,653,203 B1 | 11/2003 | Huang et al. |
| 6,673,722 B1 | 1/2004 | Yamazaki |
| 6,713,390 B1 | 3/2004 | M'Saad et al. |
| 6,740,601 B1 | 5/2004 | Tan et al. |
| 6,808,748 B1 | 10/2004 | Kapoor et al. |
| 6,812,153 B1 | 11/2004 | Hua et al. |
| 2002/0192396 A1 | 12/2002 | Wang et al. |
| 2003/0056900 A1 | 3/2003 | Li et al. |
| 2003/0159656 A1 | 8/2003 | Tan et al. |
| 2003/0207580 A1 | 11/2003 | Li et al. |
| 2003/0219540 A1 | 11/2003 | Law et al. |
| 2004/0241342 A1 | 12/2004 | Karim et al. |

FOREIGN PATENT DOCUMENTS

| | | |
|---|---|---|
| GB | 2 267 291 | 12/1993 |
| JP | 2058836 A | 2/1990 |
| JP | 7-161703 A | 6/1995 |

OTHER PUBLICATIONS

Alonso, J.C. et al., "High rate-low temperature deposition of silicon dioxide films by remote plasma enhanced chemical vapor deposition using silicon tetrachloride." Journal of Vacuum Science & Technology A: Vacuum, Surfaces, and Films, Nov. 1995, vol. 13, Issue 6, pp. 2924-2929.

Bar-Ilan et al., "A comparative study of sub-micron gap filling and planarization techniques", SPIE vol. 2636, Oct. 1995, . 277-288.

Broomfield et al., "HDP Dielectric BEOL Gapfill: A Process for Manufacturing", IEEE/SEMI Advanced Semiconductor Manufacturing Conference 1996, pp. 255-258.

Conti et al., "Processing methods to fill High aspect ration gaps without premature constriction," DUMIC Conference, Feb. 8-9, 1999, pp. 201-209.

Horiike et al., "High rate and highly selective SiO2 etching employing inductively coupled plasma and discussion on reaction kinetics", JVST A 13(3) May/Jun. 1995, pp. 801-809.

Kuo et al., "Thick SiO2 films obtained by plasma-enhanced chemical vapor deposition using hexamethyldisilazane, Carbon dioxide and hydrogen", Journal of The Electrochemical Society, 147 (7) 2000 p. 2679-2684.

Lee et al., "Dielectric Planarization Techniques For Narrow Pitch Multilevel Interconnects," VMIC Conference, pp. 85-92 (1987).

Lee et al., "Low Temperature Silicon Nitride and Silicon Dioxide Film Processing by Inductively Coupled Please Chemical Vapor Deposition" JECS; 147 (4) 2000, pp. 1481-1486.

Lim et al., "Gap-fill Performance and Film properties of PMD Films for the 65 nm device Technology", IEEE International Symposium on Semiconductor Manufacturing, Sep. 30-Oct. 2, 2003, p. 435-438.

Meeks et al., "Modeling of SiO 2 deposition in high density plasma reactors and comparisons of model predictions with experimental measurements," J. Vac. Sci. Technol. A, 16(2):544-563 (1998).

Musaka, "Single Step Gap Filling Technology fo Subhalf Micron Metal Spacings on Plasma Enhanced TEOS/O2 Chemical Vapor Deposition System," International Conference on Solid State Devices and Materials pp. 510-512, held in Japan, (1993).

Nag et al., "Comparative Evaluation of gap- fill dielectrics in shallow trench isolation for sub-0.25 micron Technologies" IEDM 1996, . 841-844.

Nalwa, H.S., *Handbook of Low and High Dielectric Constant Materials and Their Applications*, vol. 1, p. 66 (1999).

Nguyen, s.v., "High-Density Plasma Chemical Vapor Deposition of Silicon-Based Dielectric Films for Integrated Circuits," Journal of Research and Development, vol. 43, 1/2 (1999).

Pai, "High qaulity voids free oxide deposition", Materials Chemistry and Physics, 44, 1996, pp. 1-8.

Pankov et al., "The effect of hydrogen addition on the fluorine doping level of SiO2 films prepared by remote plasma enhanced chemical vapor deposition using SiF4-based plasmas", Japanese Journal of Applied Physics part 1,37 (11) Nov. 1998, pp. 6135-6141.

Peters, "Choices and challenges for shallow trench isolation", Semiconductor International, Apr. 1999, pp. 69-76.

Qian et al., "High Density Plasma Deposition and Deep Submicron Gap Fill with Low Dielectric Constant SiO2 Films," DUMIC Conference, Feb. 21-22, 1995, pp. 50-56, held in California.

Takahashi et al., "The Effect of Gas-phase additives C2H4,C2H6 and C2H2 on SiH4/O2 chemical vapor deposition". Journal of the Electrochemical Society, 143 (4) Apr. 1996, pp. 1355-1361.

Vassiliev et al., "Trends in void-free pre-metal CVD dielectrics," Solid State Technology, Mar. 2001, pp. 129-136, www.solid-state.com.

Vassiliev et al., "Properties and Gap-Fill Capability of HPD-CVD Phosphosilicate Glass Films for Subquarter-Micrometer ULSI Device Technology" Electrochemical and Solid-State Letters 3 (2), 2000, pp. 80-83.

Vassiliev, "Void-free pre-metal dielectric gap- fill capability with CVD films for subquarter-micron ULSI" DUMIC, Feb. 28-29, 2000, pp. 121-132.

Xia et al., "High Aspect Ratio Trench Filling Using Two-Step Subatmospheric Chemical Vapor Deposited Borophosphosilicate Glass for <0.18 μm Device Application" JECS, 146 (5), 1999, p. 1884-1888.

Xia et al., "High Temperature Subatmospheric Chemical Vapor Deposited Undoped Silicate Glass," JECS 146 (3) 1999, pp. 1181-1185.

Yota et al., "Advanced passivation layer using high-density plasma CVD oxide for 0.25 micron CMOS Technology" DUMIC, Feb. 16-17, 1998,pp. 185-192.

Yota et al., "Extendibility of ICP high-density plasma CVD for use as intermetal dielectric and passivation layers for 0.18 micron technology," DUMIC Feb. 8-9, 1999, pp. 71-82.

* cited by examiner

US 7,087,536 B2

SILICON OXIDE GAPFILL DEPOSITION USING LIQUID PRECURSORS

BACKGROUND OF THE INVENTION

One common step that may be performed frequently during fabrication of modern semiconductor devices is the formation of a film, such as a silicon oxide film, on a semiconductor substrate. Silicon oxide is widely used as an insulating film in the manufacture of semiconductor devices and, as is well known, may be deposited as a film by a thermal chemical vapor deposition ("CVD") process or by a plasma-enhanced CVD ("PECVD") process. In conventional thermal CVD processes, reactive gases are supplied to the substrate surface, where heat-induced chemical reactions take place to form the desired film. In a conventional plasma process, a controlled plasma is formed to decompose and/or energize reactive species to produce the desired film.

Semiconductor-device geometries have decreased significantly in size since such devices were originally developed several decades ago. This decrease in device-geometry size has consequently resulted in an increase of circuit elements and interconnections formed in integrated circuits fabricated on semiconductor substrates. One persistent challenge faced by semiconductor manufacturers in the design and fabrication of such densely packed integrated circuits is the prevention of spurious interactions between circuit elements.

Unwanted interactions are typically prevented by providing spaces, sometimes referred to in the art as "gaps" or "trenches," between adjacent elements, and filling the spaces with electrically insulative material. This arrangement acts to isolate the elements both physically and electrically. Such spaces may be used in a variety of different applications, including shallow-trench-isolation ("STI"), premetal-dielectric ("PMD"), or intermetal-dielectric ("IMD") applications, among others. As circuit densities increase with reduced feature sizes, the widths of these spaces decrease, increasing their aspect ratios, which are defined as respective ratios of a gap's depth to its width. High-aspect-ratio gaps are difficult to fill using conventional CVD methods, causing some integrated-circuit manufacturers to turn to the use high-density-plasma CVD ("HDP-CVD") techniques. The use of an HDP-CVD technique results in the formation of a plasma that has a density approximately two orders of magnitude greater than the density of a conventional, capacitively coupled plasma. Examples of HDP-CVD systems include inductively coupled plasma ("ICP") systems and electron-cyclotron-resonance ("ECR") systems, among others. There are a number of advantages of plasma-deposition processes in gapfill applications that are thus enhanced in the case of HDP-CVD deposition processes. For example, the high reactivity of the species in any plasma deposition process reduces the energy required for a chemical reaction to take place, thereby allowing the temperature of the process to be reduced compared with conventional thermal CVD processes; the temperatures of HDP-CVD processes may advantageously be even lower than with PECVD processes because the species reactivity is even higher. Similarly, HDP-CVD systems generally operate at lower pressure ranges than low-density plasma systems. The low chamber pressure provides active species having a long mean-free-path and reduced angular distribution. These factors contribute to a significant number of constituents from the plasma reaching even the deepest portions of closely spaced gaps, providing a film with improved gapfill capabilities.

Another factor that allows films deposited by HDP-CVD techniques to have improved gapfill characteristics is the occurrence of sputtering, promoted by the plasma's high density, simultaneous with film deposition. The sputtering component of HDP deposition slows deposition on certain features, such as the corners of raised surfaces, thereby contributing to the increased gapfill ability of HDP deposited films. Some HDP-CVD processes introduce an inert element that further promotes the sputtering effect, with the choice of inert element often depending on its atomic or molecular weight, a parameter that is generally correlated with the size of the sputtering effect. In addition, the sputtering effect may be further promoted by applying an electric bias with an electrode in the substrate support pedestal to use electrical attraction of the plasma species.

It was initially thought that the simultaneous deposition and etching provided by HDP-CVD processes would allow gaps to be filled in almost any application. Semiconductor manufacturers have discovered, however, that there is a practical limit to the aspect ratio of gaps that HDP-CVD deposition techniques are able to fill. The challenge of filling gaps with HDP-CVD is illustrated schematically with the cross-sectional views shown in FIGS. 1A and 1B. FIG. 1A shows a vertical cross section of a substrate 110, such as may be provided with a semiconductor wafer, having a film of features 120. Adjacent features 120 define gaps 114 that are to be filled with dielectric material, with the sidewalls 116 of the gaps being defined by the surfaces of the features 120. As the deposition proceeds, dielectric material 118 accumulates on the surfaces of the features 120, as well as on the substrate 110, and forms overhangs 122 at the corners 124 of the features 120. As deposition of the dielectric material 118 continues, the overhangs 122 typically grow faster than the gap 114 in a characteristic breadloafing fashion. Eventually, the overhangs 122 grow together to form the dielectric film 126 shown in FIG. 1B, preventing deposition into an interior void 128.

In an increasingly common process, an HDP-CVD process is used to deposit a silicon oxide film using a process gas that includes monosilane $SiH_4$, molecular oxygen $O_2$, and argon Ar. It has been reported that when such a process is used to fill certain narrow-width, high-aspect-ratio gaps, the sputtering caused by argon in the process gas hampers the gapfill effects. Specifically, it has been reported that material sputtered by argon in the process redeposits on the upper portions of the sidewalls of the gaps being filled at a rate faster than at the lower portions. This, in turn, has resulted in the formation of a void in the gap as illustrated in FIG. 1B. There accordingly remains a need in the art for techniques that allow improved gapfill with HDP-CVD processes.

BRIEF SUMMARY OF THE INVENTION

Embodiments of the invention provide for gapfill deposition of a silicon oxide film using a liquid Si—C—O—H precursor as a silicon source and using a gaseous oxidizer as a source of oxygen in a plasma-deposition process. A number of characteristics of the Si—C—O—H precursor provide more conformal deposition, allowing deposition for more aggressive gapfill applications. These characteristics include increased surface mobility and decreased sticking coefficient, which results in part from the size of the precursor molecules and from the structure of those molecules.

Thus, in some embodiments of the invention, a silicon oxide film is deposited on a substrate disposed in a substrate processing chamber. The substrate has a gap formed between adjacent raised surfaces. A liquid Si—C—O—H precursor is vaporized. A flow of the vaporized liquid Si—C—O—H precursor is provided to the substrate processing chamber. A gaseous oxidizer is also flowed to the substrate processing chamber. A deposition plasma is generated inductively from the precursor and the oxidizer in the substrate processing chamber, and the silicon oxide film is deposited over the substrate and within the gap with the deposition plasma.

In different embodiments, perhaps reflecting different gapfill requirements, the liquid precursor may comprise no Si—C bonds or may comprise a Si—C bond. The gaseous oxidizer may be selected from the group consisting of $O_2$, $N_2O$, $H_2O$, and $O_3$ in some instances. In one embodiment, the deposition plasma has an ion density between $5 \times 10^9$ and $5 \times 10^{10}$. The gap and adjacent raised features may form a part of a shallow-trench isolation structure in some instances, and may form part of a premetal dielectric structure or an intermetal dielectric structure in other instances.

In some cases, the deposited silicon oxide film may be densified. A densification gas that includes an oxygen-containing gas may be flowed into the substrate processing chamber, and a densification plasma formed from the densification gas. The deposited film is then exposed to the densification plasma to remove carbon from the silicon oxide film to produce a substantially stoichiometric $SiO_2$ film. In one embodiment, the densification gas comprises $H_2$ and $O_2$; an exemplary flow rate of the $H_2$ is between 200 and 1000 sccm and an exemplary flow rate of the $O_2$ is between 10 and 1000 sccm. Other oxygen-containing gases that may be comprised by the densification gas include $N_2O$, $H_2O$, and $O_3$ in different embodiments. The densification plasma may be a high-density plasma having an ion density of at least $10^{11}$ ions/cm$^3$. Exposure of the film to the densification plasma may take place while a pressure within the substrate processing chamber is maintained between 5 and 25 mtorr and/or while a temperature within the substrate processing chamber is maintained above 800° C.

In other embodiments of the invention, a silicon oxide film is also deposited on a substrate disposed in a substrate processing chamber. The substrate has a gap formed between adjacent raised surfaces. A liquid Si—C—O—H precursor is vaporized. A flow of the vaporized liquid Si—C—O—H precursor is provided to the substrate processing chamber and a gaseous oxidizer is also flowed to the substrate processing chamber. A deposition plasma having an ion density between $5 \times 10^9$ and $5 \times 10^{10}$ is generated from the precursor and the oxidizer in the substrate processing chamber, and the silicon oxide film is deposited over the substrate and within the gap with the deposition plasma. In certain specific embodiments, the liquid precursor and/or the oxidizer may be as described above. Furthermore, in some embodiments, a densification process may also be performed as described above.

A further understanding of the nature and advantages of the present invention may be realized by reference to the remaining portions of the specification and the drawings.

DETAILED DESCRIPTION OF THE INVENTION

As device geometries have continued to shrink, various techniques have been developed and used in order to improve gapfill capabilities of silicon oxide deposition processes. Such techniques have tended to focus on the basic recipe of forming a high-density plasma from gaseous silane and oxygen precursors, with variations being developed in process conditions, the presence of different fluent gases, different flow rates for gases, and the like. It appears that a practical limit to achieving void-free gapfill by implementing such changes is being reached around device geometries at the scale of 50 nm and below.

Embodiments of the invention use methods that deviate from the basic recipe by vaporizing a liquid Si—C—O—H precursor and forming a deposition plasma from the vaporized liquid precursor and a gaseous oxidizer, with the deposition plasma being used to fill the gap. The liquid precursors have certain physical properties that are advantageously exploited in embodiments of the invention to achieve improved bottom-up gapfill. For example, the liquid Si—C—O—H precursors provide increased surface mobility and decreased sticking coefficients, the latter property being partly a consequence of the relatively large size of the liquid Si—C—O—H molecules.

Figure 2:
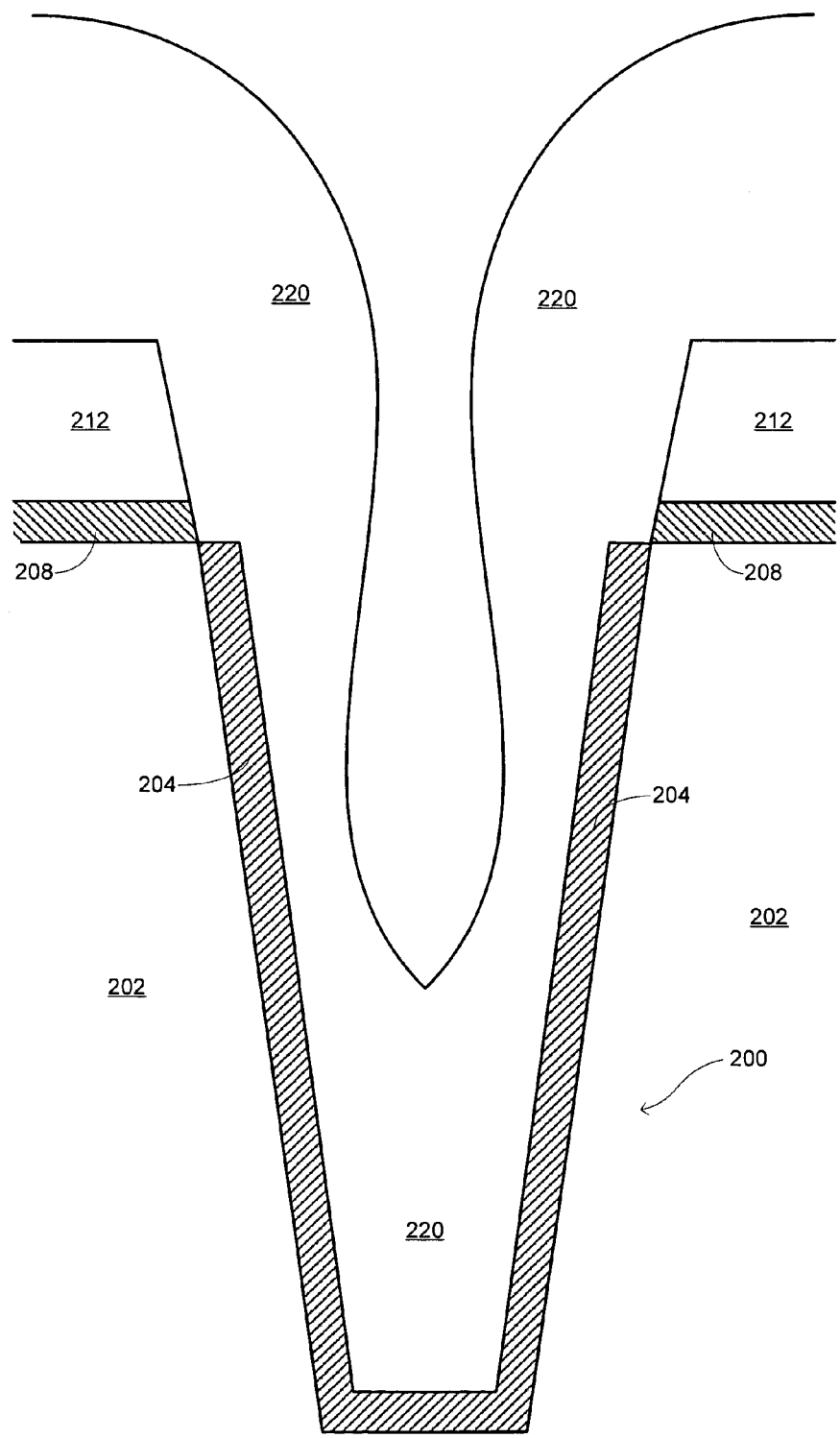
FIG. 2 is a schematic illustration of a gap comprised by a shallow-trench-isolation structure that may be filled according to embodiments of the invention.

Embodiments of the invention thus permit substantially void-free gapfill deposition of substantially stoichiometric $SiO_2$ in structures that have widths less than about 50 nm and have aspect ratios greater than about 4:1. In some instances, the aspect ratios of the structures may exceed 6:1. Such dimensions commonly arise in shallow-trench-isolation ("STI") structures, a typical example of which is illustrated in FIG. 2. The gap 200 may have a somewhat nonrectangular cross-sectional profile so that the "width" of the gap 200 is defined by the opening at the top of the gap rather than by the size of the gap at its bottom; this width is also the width used in characterizing the aspect ratio of the gap, which is defined as the ratio of the depth of the gap 200 to its width. An STI structure is typically etched in a substrate 202, such as a silicon substrate, and may be lined with a thermal oxide layer 204, the presence of which acts to decrease the width of the gap 200 and to increase the aspect ratio of the gap 200. A nitride layer 212 may be formed over a pad oxide layer 208 that is itself formed over the surface of the substrate 202. In FIG. 2, the deposition of the gapfill silicon oxide material is denoted by reference numeral 220.

In other embodiments, gapfill may be performed for other types of structures such as those that occur during premetal dielectric ("PMD") or intermetal dielectric ("IMD") applications. Often, the gaps that occur for such structures are even more aggressive than those that arise in STI applications, having widths that may be less than 30 nm and having aspect ratios that may exceed 6:1 or may even exceed 8:1. A selection of which liquid Si—C—O—H precursor to use in a particular application may depend on how aggressive any particular gapfill application is, as discussed further below.

Figure 3:
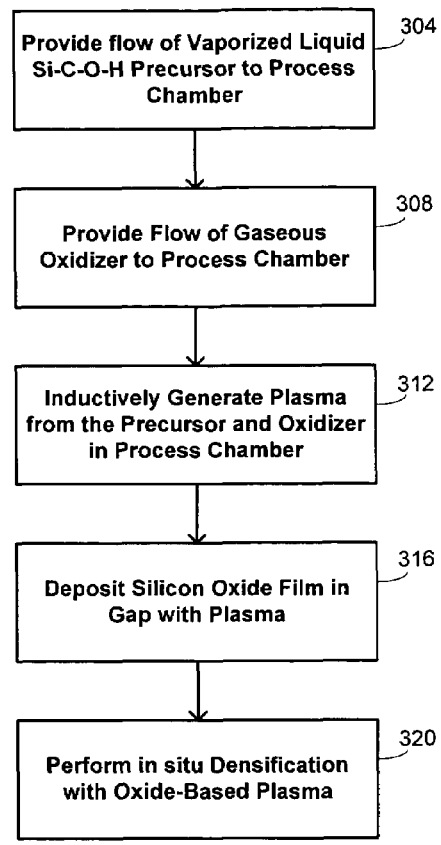
FIG. 3 is a flow diagram summarizing a variety of methods for depositing a silicon oxide film in accordance with certain embodiments of the invention.

A general overview of methods of the invention is provided with the flow diagram of FIG. 3. At block 304, a flow of a vaporized liquid precursor is provided to a substrate processing chamber. The liquid precursor, comprises a Si—C—O—H precursor, examples of which include tetraethylorthosilicate $Si(OCH_2CH_3)_4$ ("TEOS"), tetramethoxysilane $Si(OCH_3)_4$ ("TMOS"), octamethylcyclotetrasiloxane $((CH_3)_2SiO)_4$ ("OMCTS"), hexamethyldisiloxane ("HMDSO"), tetramethylcyclotetrasiloxane $(CH_3(H)SiO)_4$ ("TMCTS"), dimethyldimethoxysilane $(CH_3O)_2Si(CH_3)_2$ ("DMDMOS"), diethoxymethylsilane ("DEMS"), octamethylcyclotetrasiloxane ("OMTS"), tetramethyldisiloxane $(CH_3)_3HSiOSiH(CH_3)_2$ ("TMDSO"), trimethylmethoxysilane $(CH_3)_3SiOCH_3$ ("TMMOS"), ethyltriethoxysilane $CH_2CH_3Si(OCH_2CH_3)_3$ ("ETEOS"), dimethyldiethoxysilane $(CH_3)_2Si(OCH_2CH_3)_2$ (DMDEOS), and trimethylethoxysilane $(CH_3)_3SiOCH_2CH_3$ (TMEOS), among others. A flow of a gaseous oxidizer is also provided to the substrate processing chamber at block 308. Examples of suitable gaseous oxidizers include $O_2$, $N_2O$, $H_2O$, and $O_3$.

Figure 1A:
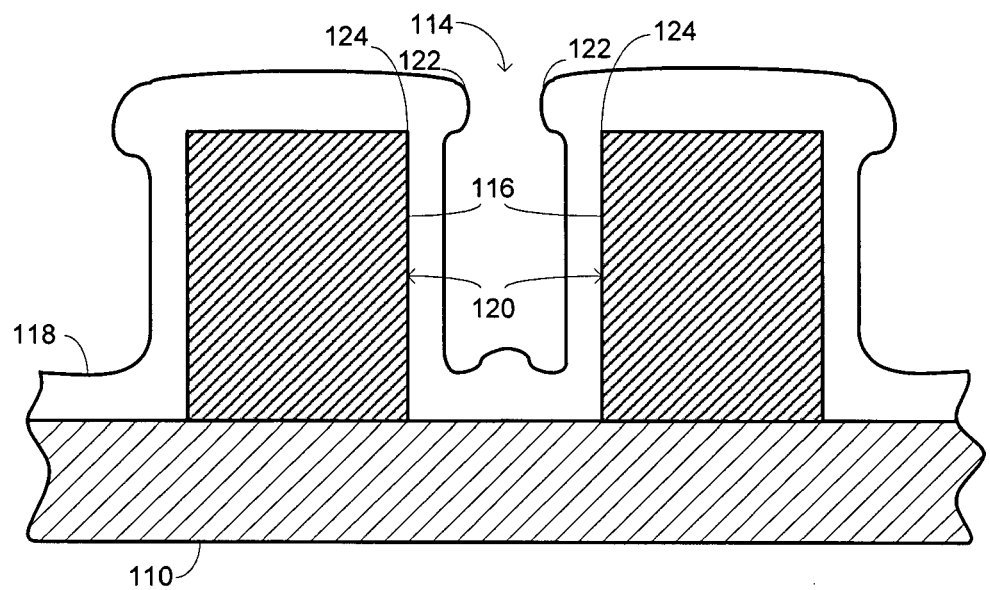
FIGS. 1A and 1B are schematic cross-sectional drawings illustrating the formation of a void during a gapfill process.
Figure 1B:
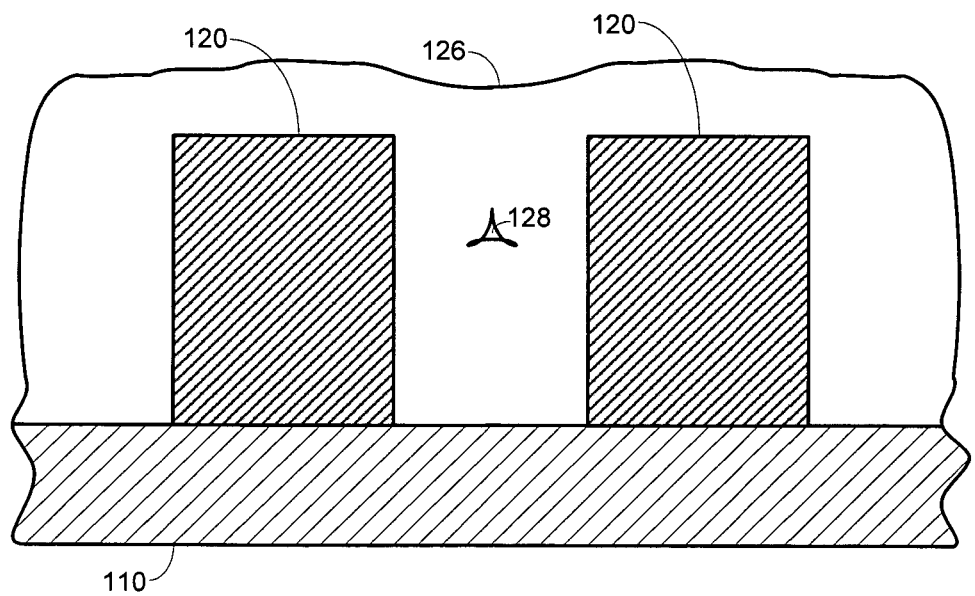

A deposition plasma is generated from the vaporized liquid precursor and the gaseous oxidizer in the substrate processing chamber at block 312. In certain embodiments, the ion density of the plasma is intermediate between ion densities that normally characterize PECVD and HDP-CVD processes. In particular, PECVD processes generally include those plasma processes in which the ion density of the plasma is less than $10^9$ ions/cm$^3$ and HDP-CVD process generally include those plasma processes in which the ion density is greater than $10^{11}$ ions/cm$^3$. In certain embodiments of the invention, an ion density of the plasma is between $5\times10^9$ and $5\times10^{10}$ ions/cm$^3$. Such an intermediate ion density reflects a tradeoff between the desire to include some sputtering in the process with the fact that the heavy intermediate species generated from the vaporized liquid precursors produce high sputtering levels if the plasma density is too high. This tradeoff is particularly relevant to the gapfill applications described herein because of the intimate relationship between effective gapfill and the relative levels of deposition and sputtering produced by the ion density of the plasma. If the ion density is as low as for conventional PECVD processes, there will be substantially no sputtering so that void formation will proceed similarly as in conventional PECVD processes; if the ion density is as high as for conventional HDP-CVD processes, the high sputtering levels caused by the large intermediate species may result in excess redeposition on the sidewalls of the gap, causing excessive breadloafing as described in connection with FIG. 1.

As FIG. 3 indicates, ionization at the desired level may be achieved with an inductive-coupling process, similar to what is conventionally used in producing high-density plasmas. This acts to ionize the oxidizer more efficiently than would be achieved with a capacitive-coupling process or PECVD process, and also acts to break up the carbon bonds in the liquid precursor more efficiently. This is desirable so that the released carbon may be oxidized with some of the released oxygen ions to form $CO_2$ that may be exhausted from the substrate processing chamber, rather than being incorporated into the film.

At block 316 of FIG. 3, the silicon oxide film is deposited in the gap with the deposition plasma. Bottom-up gapfill is enhanced by at least two effects. First, the surface mobility of the intermediate species is enhanced when compared with the surface mobility provided by gaseous silane precursors. Second, the sticking coefficient of the intermediate precursors is decreased when compared with gaseous silane precursors. This decrease in sticking coefficient is one consequence of the increased size of the intermediate precursors. The combination of these effects is believed to improve bottom-up gapfilling because less of the silicon oxide material sticks to the top surfaces. For instance, in the case of the STI structure shown in FIG. 2, use of the liquid precursors results in decreased deposition of material on the nitride structures 212 because of the changes in surface mobility and sticking coefficient, so that the breadloafing effect is mitigated. In addition, the presence of carbon in the precursor is believed to help mobility of radicals on the substrate surface, and thereby further enhance the gapfilling capability. The deposition of material is thus more conformal.

Figure 4A:
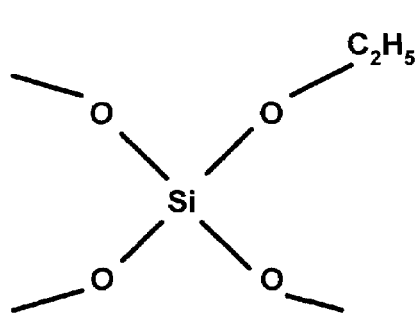
FIGS. 4A and 4B illustrate chemical structures for certain types of liquid Si—C—O—H precursors that may be used in embodiments of the invention.
Figure 4B:
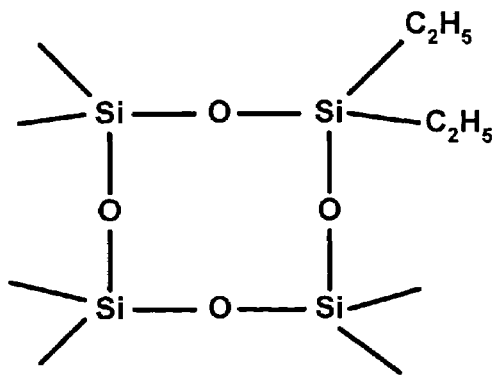

Another factor that may affect these properties, particularly the sticking coefficient, is the strength of the molecular bonds in the precursor molecules. For example, FIGS. 4A and 4B provide an illustration of the different chemical structures of TEOS (FIG. 4A) and OMCTS (FIG. 4B). The TEOS molecules have no Si—C bonds, which are known to be strong bonds, while the OMCTS molecules have a Si—C bond. Because of the strength of the Si—C bond, the OMCTS molecule is more difficult to dissociate into intermediate species than is the TEOS molecule, resulting in an even lower sticking coefficient for the OMCTS molecule. More generally, those precursors that include Si—C bonds are expected to have lower sticking coefficients than those precursors that do not include Si—C bonds, making them generally more suitable for deposition in more-aggressive gapfill applications. In some instances, it may be preferable for the liquid precursor to have a $CH_3$:Si stoichiometric ratio that exceeds 2, such as may be provided with HMDSO with a $CH_3$:Si stoichiometric ratio of 3. The use of liquid precursors in the embodiments described herein thus provides improved conformality of the deposited material when compared with more conventional gaseous silane precursors.

Another effect of the greater stability of precursor molecules that include Si—C bonds is that greater amounts of carbon may be incorporated into the deposited silicon oxide film. Accordingly, in some embodiments an in situ densification process is performed at block 320 of FIG. 3 that acts to remove incorporated carbon from the film. The densification may be performed using an oxide-based plasma, such as may be provided by generating a densification plasma from on oxygen-containing precursor like $O_2$, $N_2O$, $H_2O$, or $O_3$. In a specific embodiment, the precursors for the densification plasma comprise $H_2$ and $O_2$, which may be provided with respective flow rates of between 200 and 1000 sccm for $H_2$ and of between 10 and 1000 sccm for $O_2$. The plasma may thus comprise OH$^-$ ions, which may then diffuse through the deposited silicon oxide film to react with carbon atoms and thereby scavenge the carbon atoms from the film. To provide good diffusion mobility through the deposited silicon oxide film, the temperature within the substrate processing chamber during exposure of the film to the densification plasma may be greater than 800° C. and/or the pressure within the substrate processing chamber may be maintained between 5 mtorr and 25 mtorr. After densification, the resulting film may be a substantially stoichiometric $SiO_2$ film.

In some embodiments, the densification may be performed with an ion density similar to that used for deposition of the film, i.e. between $5\times10^9$ and $5\times10^{10}$, but in other embodiments, the densification plasma may be a high-density plasma having an ion density that exceeds $10^{11}$ ions/cm$^3$. Performing the densification in situ advantageously allows the densification plasma to be generated without extinguishing the deposition plasma by changing the rates of flows provided to the substrate processing system and by changing the processing conditions. In specific embodiments where the oxygen-containing gas used for densification is the same as the gaseous oxidizer used for deposition, the densification plasma may be generated by stopping flow of the vaporized liquid precursor, and perhaps changing the flow of the gaseous oxidizer.

Exemplary Substrate Processing System

Figure 5A:
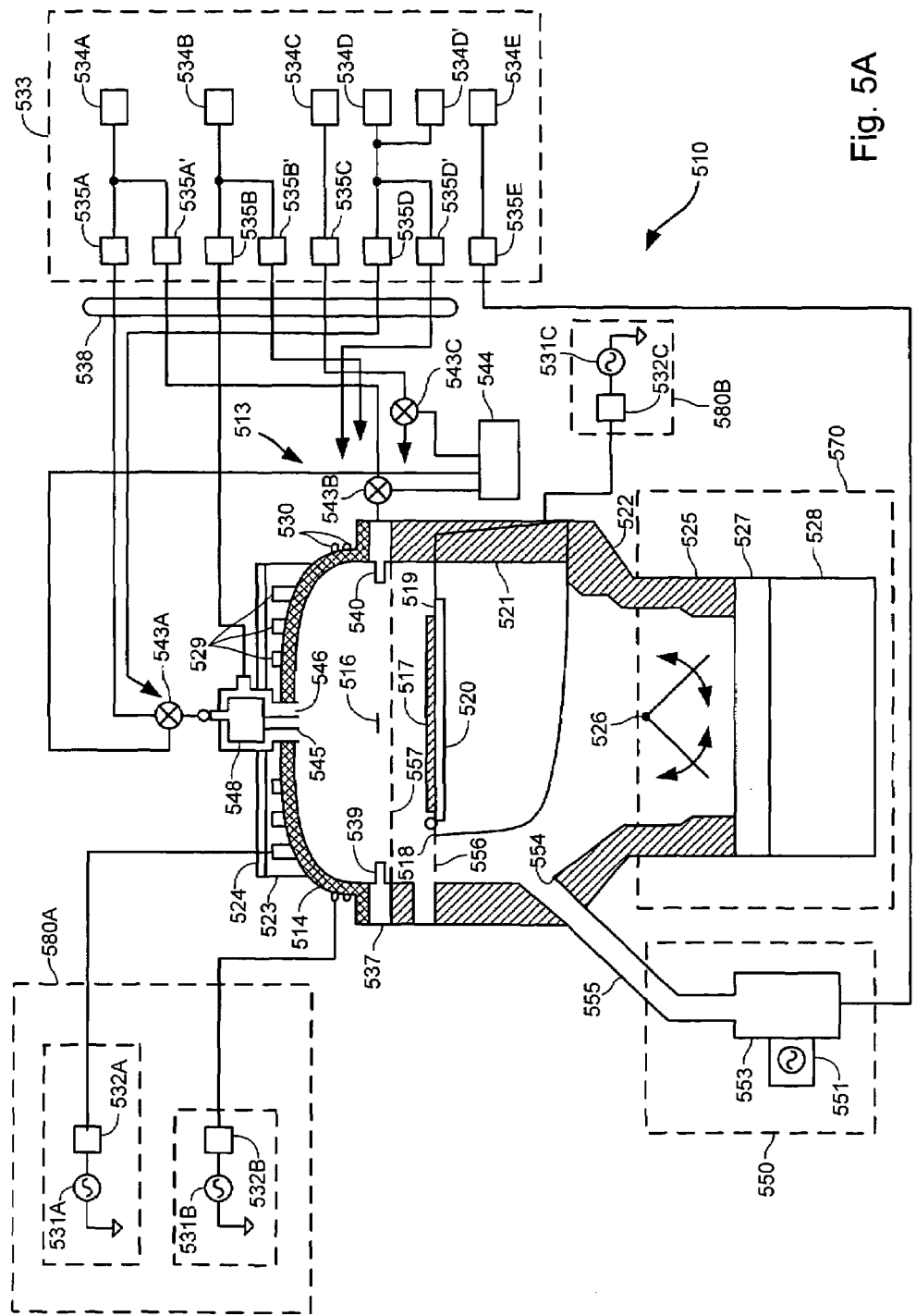
FIG. 5A is a simplified diagram of one embodiment of an inductive-coupling plasma deposition system that may be used in embodiments of the invention.
Figure 5B:
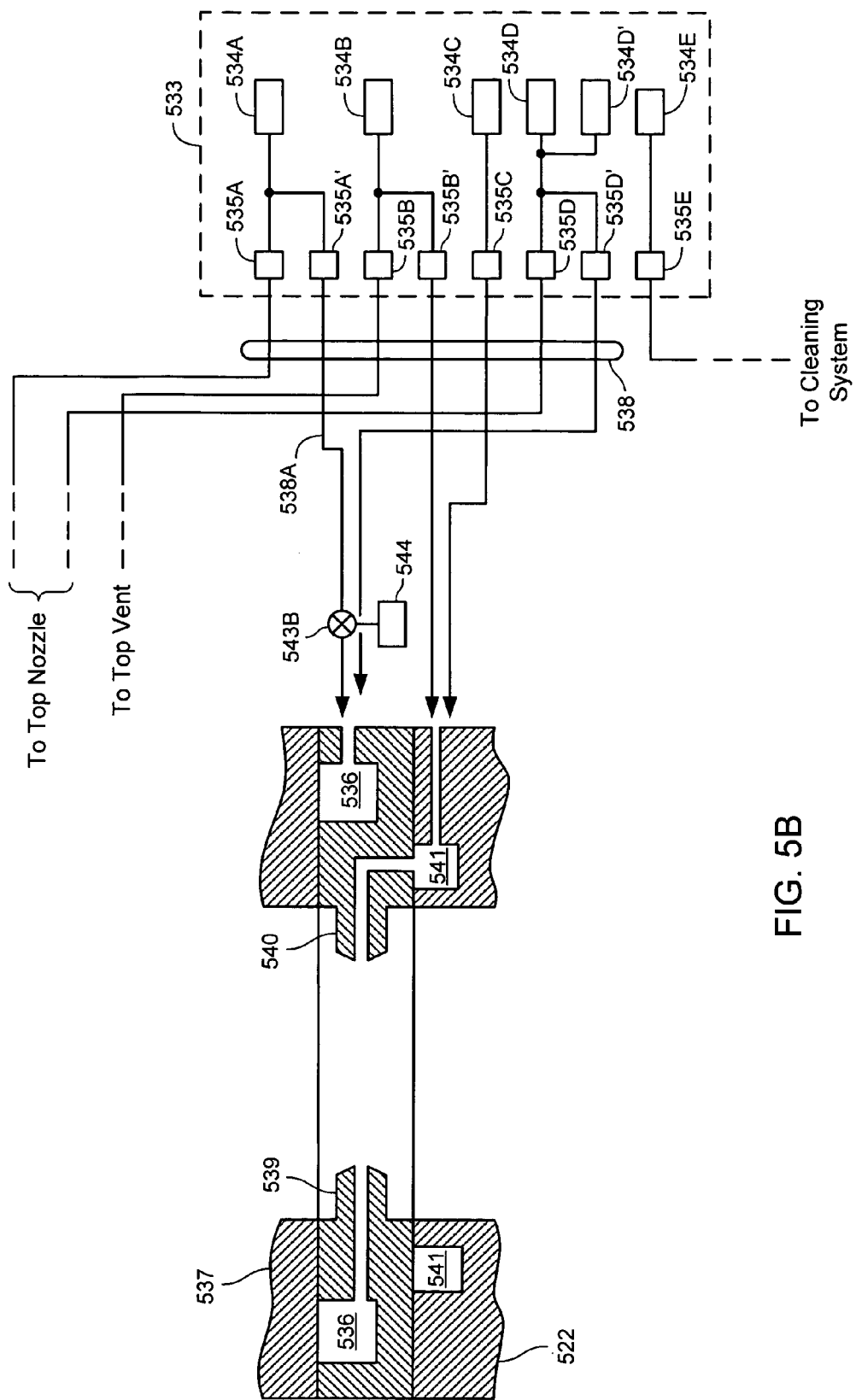
FIG. 5B is a simplified cross section of a gas ring that may be used in conjunction with the exemplary processing system of FIG. 5A.

The methods described above may be implemented with a variety of inductive-coupling plasma processing systems, some of which are described in detail in connection with FIGS. 5A and 5B. FIG. 5A schematically illustrates the structure of such an inductive-coupling plasma processing system 510 in one embodiment. The system 510 includes a chamber 513, a vacuum system 570, a source plasma system 580A, a bias plasma system 580B, a gas/vapor delivery system 533, and a remote plasma cleaning system 550.

The upper portion of chamber 513 includes a dome 514, which is made of a ceramic dielectric material, such as aluminum oxide or aluminum nitride. Dome 514 defines an upper boundary of a plasma processing region 516. Plasma processing region 516 is bounded on the bottom by the upper surface of a substrate 517 and a substrate support member 518.

A heater plate 523 and a cold plate 524 surmount, and are thermally coupled to, dome 514. Heater plate 523 and cold plate 524 allow control of the dome temperature to within about ±10° C. over a range of about 100° C. to 200° C. This allows optimizing the dome temperature for the various processes. For example, it may be desirable to maintain the dome at a higher temperature for cleaning or etching processes than for deposition processes. Accurate control of the dome temperature also reduces the flake or particle counts in the chamber and improves adhesion between the deposited layer and the substrate.

The lower portion of chamber 513 includes a body member 522, which joins the chamber to the vacuum system. A base portion 521 of substrate support member 518 is mounted on, and forms a continuous inner surface with, body member 522. Substrates are transferred into and out of chamber 513 by a robot blade (not shown) through an insertion/removal opening (not shown) in the side of chamber 513. Lift pins (not shown) are raised and then lowered under the control of a motor (also not shown) to move the substrate from the robot blade at an upper loading position 557 to a lower processing position 556 in which the substrate is placed on a substrate receiving portion 519 of substrate support member 518. Substrate receiving portion 519 includes an electrostatic chuck 520 that secures the substrate to substrate support member 518 during substrate processing. In a preferred embodiment, substrate support member 518 is made from an aluminum oxide or aluminum ceramic material.

Vacuum system 570 includes throttle body 525, which houses twin-blade throttle valve 526 and is attached to gate valve 527 and turbo-molecular pump 528. It should be noted that throttle body 525 offers minimum obstruction to gas/vapor flow, and allows symmetric pumping. Gate valve 527 can isolate pump 528 from throttle body 525, and can also control chamber pressure by restricting the exhaust flow capacity when throttle valve 526 is fully open. The arrangement of the throttle valve, gate valve, and turbo-molecular pump allow accurate and stable control of chamber pressures from between about 1 millitorr to about 2 torr.

The source plasma system 580A includes a top coil 529 and side coil 530, mounted on dome 514. A symmetrical ground shield (not shown) reduces electrical coupling between the coils. Top coil 529 is powered by top source RF (SRF) generator 531A, whereas side coil 530 is powered by side SRF generator 531B, allowing independent power levels and frequencies of operation for each coil. This dual coil system allows control of the radial ion density in chamber 513, thereby improving plasma uniformity. Side coil 530 and top coil 529 are typically inductively driven, which does not require a complimentary electrode. In a specific embodiment, the top source RF generator 531A provides up to 2,500 watts of RF power at nominally 2 MHz and the side source RF generator 531B provides up to 5,000 watts of RF power at nominally 2 MHz. The operating frequencies of the top and side RF generators may be offset from the nominal operating frequency (e.g. to 1.7–1.9 MHz and 1.9–2.1 MHz, respectively) to improve plasma-generation efficiency.

A bias plasma system 580B includes a bias RF ("BRF") generator 531C and a bias matching network 532C. The bias plasma system 580B capacitively couples substrate portion 517 to body member 522, which act as complimentary electrodes. The bias plasma system 580B serves to enhance the transport of plasma species (e.g., ions) created by the source plasma system 580A to the surface of the substrate. In a specific embodiment, bias RF generator provides up to 5,000 watts of RF power at 13.56 MHz.

RF generators 531A and 5311B include digitally controlled synthesizers and operate over a frequency range between about 1.8 to about 2.1 MHz. Each generator includes an RF control circuit (not shown) that measures reflected power from the chamber and coil back to the generator and adjusts the frequency of operation to obtain the lowest reflected power, as understood by a person of ordinary skill in the art. RF generators are typically designed to operate into a load with a characteristic impedance of 50 ohms. RF power may be reflected from loads that have a different characteristic impedance than the generator. This can reduce power transferred to the load. Additionally, power reflected from the load back to the generator may overload and damage the generator. Because the impedance of a plasma may range from less than 5 ohms to over 900 ohms, depending on the plasma ion density, among other factors, and because reflected power may be a function of frequency, adjusting the generator frequency according to the reflected power increases the power transferred from the RF generator to the plasma and protects the generator. Another way to reduce reflected power and improve efficiency is with a matching network.

Matching networks 532A and 532B match the output impedance of generators 531A and 531B with their respective coils 529 and 530. The RF control circuit may tune both matching networks by changing the value of capacitors within the matching networks to match the generator to the load as the load changes. The RF control circuit may tune a matching network when the power reflected from the load back to the generator exceeds a certain limit. One way to provide a constant match, and effectively disable the RF control circuit from tuning the matching network, is to set the reflected power limit above any expected value of reflected power. This may help stabilize a plasma under some conditions by holding the matching network constant at its most recent condition.

Other measures may also help stabilize a plasma. For example, the RF control circuit can be used to determine the power delivered to the load (plasma) and may increase or decrease the generator output power to keep the delivered power substantially constant during deposition of a layer.

A gas/vapor delivery system 533 provides gases and/or vaporized liquids from several sources, 534A–534E chamber for processing the substrate via delivery lines 538 (only some of which are shown). As would be understood by a person of skill in the art, the actual sources used for sources 534A–534E and the actual connection of delivery lines 538 to chamber 513 varies depending on the deposition and cleaning processes executed within chamber 513. Gases and/or vaporized liquids are introduced into chamber 513 through a ring 537 and/or a top nozzle 545. FIG. 5B is a simplified, partial cross-sectional view of chamber 513 showing additional details of ring 537.

In one embodiment, first and second sources, 534A and 534B, and first and second flow controllers, 535A' and 535B', provide gas and/or vaporized liquid to ring plenum 536 in ring 537 via delivery lines 538 (only some of which are shown). Ring 537 has a plurality of source nozzles 539 (only one of which is shown for purposes of illustration) that provide a uniform flow over the substrate. Nozzle length and nozzle angle may be changed to allow tailoring of the uniformity profile and utilization efficiency for a particular process within an individual chamber. In a preferred embodiment, ring 537 has 12 source nozzles made from an aluminum oxide ceramic.

Ring 537 also has a plurality of oxidizer nozzles 540 (only one of which is shown), which in a preferred embodiment are co-planar with and shorter than source nozzles 539, and in one embodiment receive the oxidizer gas from body plenum 541. In some embodiments it is desirable not to mix source vaporized liquid and oxidizer gas before injecting the gas and vapor into chamber 513. In other embodiments, oxidizer gas and source vaporized liquid may be mixed prior to injection into chamber 513 by providing apertures (not shown) between body plenum 541 and ring plenum 536. In one embodiment, third, fourth, and fifth sources, 534C, 534D, and 534D', and third and fourth flow controllers, 535C and 535D', provide gas/vapor to body plenum via delivery lines 538. Additional valves, such as 543B (other valves not shown), may shut off a flow from the flow controllers to the chamber. According to embodiments of the invention, the liquid precursors may be vaporized by bubbling a delivery gas such as helium through the liquid precursor in a bubbler assembly or by introducing the helium to a liquid injection valve. The flow of the delivery gas, the pressure in the bubbler, and the bubbler temperature are regulated to obtain the desired flow rates of the vaporized liquid precursor.

In embodiments where flammable, toxic, or corrosive substances are used, it may be desirable to eliminate any substance remaining in the delivery lines after a deposition. This may be accomplished using a 3-way valve, such as valve 543B, to isolate chamber 513 from delivery line 538A and to vent delivery line 538A to vacuum foreline 544, for example. As shown in FIG. 5A, other similar valves, such as 543A and 543C, may be incorporated on other delivery lines. Such three-way valves may be placed as close to chamber 513 as practical, to minimize the volume of the unvented delivery line (between the three-way valve and the chamber). Additionally, two-way (on-off) valves (not shown) may be placed between a mass flow controller ("MFC") and the chamber or between a source and an MFC.

Referring again to FIG. 5A, chamber 513 also has top nozzle 545 and top vent 546. Top nozzle 545 and top vent 546 allow independent control of top and side flows of the gases and/or vaporized liquids, which improves film uniformity and allows fine adjustment of the film's deposition and doping parameters. Top vent 546 is an annular opening around top nozzle 545. In one embodiment, first source 534A supplies source nozzles 539 and top nozzle 545. Source nozzle MFC 535A' controls the amount of gas/vapor delivered to source nozzles 539 and top nozzle MFC 535A controls the amount of gas/vapor delivered to top nozzle 545. Similarly, two MFCs 535B and 535B' may be used to control the flow of oxygen to both top vent 546 and oxidizer nozzles 540 from a single source of oxygen, such as source 534B. The gas/vapor supplied to top nozzle 545 and top vent 546 may be kept separate prior to flowing the gas/vapor into chamber 513, or the gas/vapor may be mixed in top plenum 548 before they flow into chamber 513. Separate sources of the same gas/vapor may be used to supply various portions of the chamber.

A remote microwave-generated plasma cleaning system 550 is provided to periodically clean deposition residues from chamber components. The cleaning system includes a remote microwave generator 551 that creates a plasma from a cleaning gas source 534E (e.g., molecular fluorine, nitrogen trifluoride, other fluorocarbons or equivalents) in reactor cavity 553. The reactive species resulting from this plasma are conveyed to chamber 513 through cleaning gas feed port 554 via applicator tube 555. The materials used to contain the cleaning plasma (e.g., cavity 553 and applicator tube 555) must be resistant to attack by the plasma. The distance between reactor cavity 553 and feed port 554 should be kept as short as practical, since the concentration of desirable plasma species may decline with distance from reactor cavity 553. Generating the cleaning plasma in a remote cavity allows the use of an efficient microwave generator and does not subject chamber components to the temperature, radiation, or bombardment of the glow discharge that may be present in a plasma formed in situ. Consequently, relatively sensitive components, such as electrostatic chuck 520, do not need to be covered with a dummy wafer or otherwise protected, as may be required with an in situ plasma cleaning process.

An example of a system that may incorporate some or all of the subsystems and routines described above would be the ULTIMA™ system, manufactured by APPLIED MATERIALS, INC., of Santa Clara, Calif., configured to practice the present invention. Further details of such a system are disclosed in commonly assigned U.S. Pat. No. 6,170,428, filed Jul. 15, 1996 by Fred C. Redeker, Farhad Moghadam, Hirogi Hanawa, Tetsuya Ishikawa, Dan Maydan, Shijian Li, Brian Lue, Robert Steger, Yaxin Wang, Manus Wong and Ashok Sinha listed as co-inventors, the disclosure of which is incorporated herein by reference. The described system is for exemplary purpose only. It would be a matter of routine skill for a person of skill in the art to select an appropriate conventional substrate processing system and computer control system to implement the present invention.

Those of ordinary skill in the art will realize that processing parameters can vary for different processing chambers and different processing conditions, and that different precursors can be used without departing from the spirit of the invention. Other variations will also be apparent to persons of skill in the art. These equivalents and alternatives are intended to be included within the scope of the present invention. Therefore, the scope of this invention should not be limited to the embodiments described, but should instead be defined by the following claims.

What is claimed is:

1. A method of depositing a silicon oxide film on a substrate disposed in a substrate processing chamber, the substrate having a gap formed between adjacent raised surfaces with a width less than 50 nm, the method comprising:
   vaporizing a liquid Si—C—O—H precursor;
   providing a flow of the vaporized liquid Si—C—O—H precursor to the substrate processing chamber;
   flowing a gaseous oxidizer to the substrate processing chamber;
   inductively generating a deposition plasma having an ion density between $5 \times 10^9$ and $5 \times 10^{10}$ ions/cm$^3$ from the precursor and the oxidizer in the substrate processing chamber; and
   depositing the silicon oxide film over the substrate and within the gap with the deposition plasma.

2. The method recited in claim 1 wherein the liquid precursor comprises no Si—C bonds.

3. The method recited in claim 1 wherein the liquid precursor comprises a Si—C bond.

4. The method recited in claim 3 wherein the liquid precursor has a CH$_3$:Si stoichiometric ratio that exceeds 2.

5. The method recited in claim 1 wherein the gaseous oxidizer is selected from the group consisting of O$_2$, N$_2$O, H$_2$O, and O$_3$.

6. The method recited in claim 1 wherein the gap and adjacent raised features form part of a shallow-trench-isolation structure.

7. The method recited in claim 1 wherein the gap and adjacent raised features form part of a premetal dielectric structure or an intermetal dielectric structure.

8. The method recited in claim 1 further comprising densifying the deposited silicon oxide film, wherein densifying comprises:
   flowing a densification gas that includes an oxygen-containing gas into the substrate processing chamber;
   forming a densification plasma from the densification gas; and
   exposing the deposited film to the densification plasma, whereby the silicon oxide film is a substantially stoichiometric SiO$_2$ film.

9. The method recited in claim 8 wherein the densification gas comprises H$_2$ and O$_2$.

10. The method recited in claim 9 wherein a flow rate of the H$_2$ is between 200 and 1000 sccm and a flow rate of the O$_2$ is between 10 and 1000 sccm.

11. The method recited in claim 8 wherein the densification gas comprises N$_2$O.

12. The method recited in claim 8 wherein the densification gas comprises H$_2$O.

13. The method recited in claim 8 wherein the densification gas comprises O$_3$.

14. The method recited in claim 8 wherein the densification plasma is a high-density plasma having an ion density of at least $10^{11}$ ions/cm$^3$.

15. The method recited in claim 8 wherein exposing the deposited film to the densification plasma is performed while a pressure within the substrate processing chamber is maintained between 5 and 25 mtorr.

16. The method recited in claim 8 wherein exposing the deposited film to the densification plasma is performed while a temperature within the substrate processing chamber is maintained above 800° C.

17. A method of depositing a silicon oxide film on a substrate disposed in a substrate processing chamber, the substrate having a gap formed between adjacent raised surfaces with a width less than 50 nm, the method comprising:
   vaporizing a liquid Si—C—O—H precursor;
   providing a flow of the vaporized liquid Si—C—O—H precursor to the substrate processing chamber;
   flowing a gaseous oxidizer to the substrate processing chamber;
   generating a deposition plasma having an ion density between $5 \times 10^9$ and $5 \times 10^{10}$ ions/cm$^3$ from the precursor and the oxidizer in the substrate processing chamber; and
   depositing the silicon oxide film over the substrate and within the gap with the deposition plasma.

18. The method recited in claim 17 wherein the liquid precursor comprises no Si—C bonds.

19. The method recited in claim 17 wherein the liquid precursor comprises a Si—C bond.

20. The method recited in claim 17 wherein the gaseous oxidizer is selected from the group consisting of O$_2$, N$_2$O, H$_2$O, and O$_3$.

21. The method recited in claim 17 further comprising densifying the deposited silicon oxide film, wherein densifying comprises:
   flowing a densification gas that includes an oxygen-containing gas into the substrate processing chamber;
   forming a densification plasma having an ion density of at least $10^{11}$ ions/cm$^3$ from the densification gas; and
   exposing the deposited film to the densification plasma, whereby the silicon oxide film is a substantially stoichiometric SiO$_2$ film.

22. A method of depositing a silicon oxide film on a substrate disposed in a substrate processing chamber, the substrate having a gap formed between adjacent raised surfaces with a width less than 50 nm and an aspect ratio greater than 4:1, the method comprising:
   vaporizing a liquid Si—C—O—H precursor;
   providing a flow of the vaporized liquid Si—C—O—H precursor to the substrate processing chamber;
   flowing a gaseous oxidizer selected from the group consisting of O$_2$, N$_2$O, H$_2$O, and O$_3$ to the substrate processing chamber;
   inductively generating a deposition plasma having an ion density between $5 \times 10^9$ and $5 \times 10^{10}$ from the precursor and the oxidizer in the substrate processing chamber;
   depositing the silicon oxide film over the substrate and within the gap with the deposition plasma;
   generating a densification plasma from a densification gas that includes an oxygen-containing gas without extinguishing the deposition plasma; and
   exposing the silicon oxide film to the densification gas at a pressure between 5 and 25 mtorr and at a temperature greater than 800° C., whereby the silicon oxide film is a substantially stoichiometric SiO$_2$ film.

23. The method recited in claim 22 wherein the densification gas comprises H$_2$ and O$_2$.

24. The method recited in claim 23 wherein a flow rate of the H$_2$ is between 200 and 1000 sccm and a flow rate of the O$_2$ is between 10 and 1000 sccm.

* * * * *